US009245991B2

(12) United States Patent
Liu et al.

(10) Patent No.: US 9,245,991 B2
(45) Date of Patent: Jan. 26, 2016

(54) SEMICONDUCTOR DEVICE, HIGH ELECTRON MOBILITY TRANSISTOR (HEMT) AND METHOD OF MANUFACTURING

(71) Applicant: TAIWAN SEMICONDUCTOR MANUFACTURING COMPANY, LTD., Hsinchu (TW)

(72) Inventors: Po-Chun Liu, Hsinchu (TW); Chi-Ming Chen, Zhubei (TW); Chen-Hao Chiang, Jhongli (TW); Chung-Yi Yu, Hsinchu (TW); Chia-Shiung Tsai, Hsinchu (TW); Xiaomeng Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 89 days.

(21) Appl. No.: 13/964,530

(22) Filed: Aug. 12, 2013

(65) Prior Publication Data
US 2015/0041825 A1   Feb. 12, 2015

(51) Int. Cl.
*H01L 21/44* (2006.01)
*H01L 29/778* (2006.01)
*H01L 29/66* (2006.01)
*H01L 29/20* (2006.01)

(52) U.S. Cl.
CPC ...... *H01L 29/7783* (2013.01); *H01L 29/66462* (2013.01); *H01L 29/2003* (2013.01)

(58) Field of Classification Search
CPC .............. H01L 29/778; H01L 29/7783; H01L 29/1033; H01L 29/2003; H01L 29/66431; H01L 29/66462
USPC .............................. 257/43, 192–194, E29.091
See application file for complete search history.

(56) References Cited

U.S. PATENT DOCUMENTS

| 7,705,415 | B1* | 4/2010 | Nabet | 257/449 |
|---|---|---|---|---|
| 8,866,192 | B1* | 10/2014 | Chen et al. | 257/194 |
| 2006/0281238 | A1* | 12/2006 | Harris et al. | 438/172 |
| 2008/0210927 | A1* | 9/2008 | Hudait et al. | 257/14 |
| 2009/0065810 | A1* | 3/2009 | Honea et al. | 257/192 |
| 2010/0096668 | A1* | 4/2010 | Briere | 257/194 |
| 2010/0155720 | A1* | 6/2010 | Kaneko | 257/43 |
| 2010/0264462 | A1* | 10/2010 | Hirler et al. | 257/194 |
| 2010/0308375 | A1* | 12/2010 | Birkhahn | 257/194 |
| 2011/0018002 | A1* | 1/2011 | Chen et al. | 257/76 |
| 2011/0092057 | A1* | 4/2011 | Suvorov | 438/522 |
| 2011/0284868 | A1* | 11/2011 | Briere | 257/76 |
| 2012/0267636 | A1* | 10/2012 | Zundel et al. | 257/76 |
| 2012/0313106 | A1* | 12/2012 | He | 257/76 |

(Continued)

OTHER PUBLICATIONS

Ghoshtagore, R. N., et al., "Self-Diffusion in Silicon Carbide", Physical Review, vol. 143, No. 2, Mar. 1966, pp. 623-626.

(Continued)

*Primary Examiner* — Michael Lebentritt
(74) *Attorney, Agent, or Firm* — Hauptman Ham, LLP (57) ABSTRACT

A semiconductor device includes a substrate, a channel layer over the substrate, an active layer over the channel layer, and a barrier structure between the substrate and the channel layer. The active layer is configured to cause a two dimensional electron gas (2DEG) to be formed in the channel layer along an interface between the channel layer and the active layer. The barrier structure is configured to block diffusion of at least one of a material of the substrate or a dopant toward the channel layer.

20 Claims, 5 Drawing Sheets

(56) References Cited

U.S. PATENT DOCUMENTS

| | | | | |
|---|---|---|---|---|
| 2013/0334538 A1* | 12/2013 | Saunier | | 257/76 |
| 2014/0106516 A1* | 4/2014 | Curatola et al. | | 438/172 |
| 2014/0327012 A1* | 11/2014 | Ougazzaden et al. | | 257/76 |
| 2014/0346568 A1* | 11/2014 | De Jaeger et al. | | 257/194 |
| 2014/0367700 A1* | 12/2014 | Prechtl et al. | | 257/77 |
| 2014/0374765 A1* | 12/2014 | Curatola | | 257/76 |
| 2015/0053992 A1* | 2/2015 | Liu et al. | | 257/76 |
| 2015/0060861 A1* | 3/2015 | Chiu et al. | | 257/66 |
| 2015/0069409 A1* | 3/2015 | Dargis et al. | | 257/76 |
| 2015/0104911 A1* | 4/2015 | Prechtl | | 438/172 |

OTHER PUBLICATIONS

Moro, L., et al., "Silicon Carbide Formation by Annealing C60 Films on Silicon", J. Appl. Phys. 81 (9), May 1, 1997, pp. 6141-6146.

Jakiela, Rafal, et al., "Si Diffusion in Epitaxial GaN", Phys. Stat. Sol. (c) 3, No. 6, 1416-1419 (2006)/DOI 10.1002/pssc.2500565112., pp. 1416-1419.

\* cited by examiner

SEMICONDUCTOR DEVICE, HIGH ELECTRON MOBILITY TRANSISTOR (HEMT) AND METHOD OF MANUFACTURING

BACKGROUND

Due to high current density, high breakdown voltage, and low ON resistance, High Electron Mobility Transistors (HEMTs) are suitable for use in power applications. An HEMT structure includes a channel layer and an active layer. A two-dimensional electron gas (2DEG) is generated in the channel layer, adjacent an interface with the active layer. The 2DEG is used in the HEMT structure as charge carriers. A consideration in designing HEMT structures involves breakdown voltage improvements. A breakdown voltage of an HEMT structure is a gate voltage at which the drain current sharply increases. A high breakdown voltage indicates the ability of the HEMT structure to withstand a high gate voltage without being damaged and/or exhibiting irregular current behaviors.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details Like reference numerals in the drawings denote like elements.

A high breakdown voltage is achievable in an HEMT structure by forming a high resistivity layer between the channel layer and a substrate of the HEMT structure. In some situations, a material of the substrate is diffused into the high resistivity layer and/or a dopant in the high resistivity layer is diffused into the channel layer, causing one or more negative impacts on performance of the HEMT structure. In some embodiments, a barrier structure is formed between the substrate and the channel layer to block diffusion of at least one of the material of the substrate or the dopant toward the channel layer. As a result, a high breakdown voltage is achievable in the HEMT structure, while making it possible to avoid one or more potential negative impacts. The described structure and/or method is/are suitable not only for HEMT structures, but also for other types of GaN-based semiconductor devices.

Figure 1:
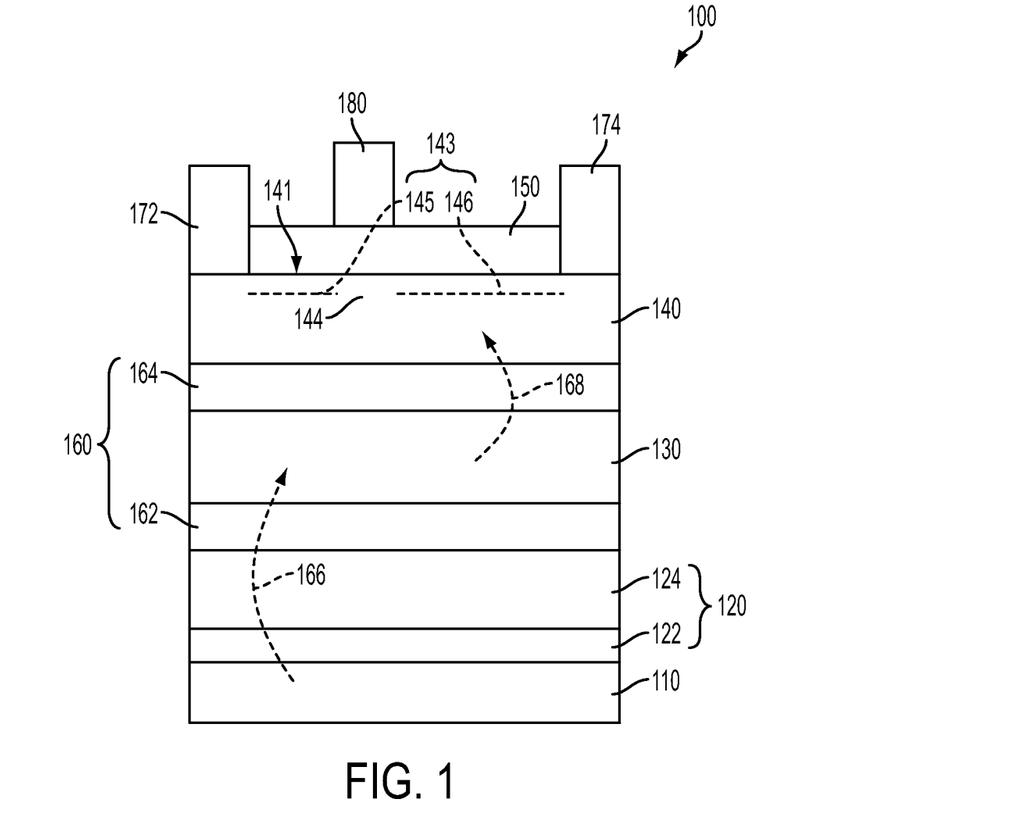
FIG. 1 is a schematic cross-sectional view of a semiconductor device in accordance with some embodiments.

FIG. 1A is a schematic cross-sectional view of a semiconductor device 100 in accordance with some embodiments. The semiconductor device 100 comprises a substrate 110, a transition structure 120 over the substrate 110, a buffer layer 130 over the transition structure 120, a channel layer 140 over the buffer layer 130, and an active layer 150 over the channel layer 140. The semiconductor device 100 further comprises a barrier structure 160 between the substrate 110 and the channel layer 140. The semiconductor device 100 also comprises a source electrode 172 and a drain electrode 174 over the channel layer 140, and a gate electrode 180 over the active layer 150. In some embodiments, the source electrode 172 and the drain electrode 174 are formed over the active layer 150.

In some embodiments, the substrate 110 includes a silicon carbide (SiC) substrate, sapphire substrate, or a silicon (Si) substrate. In at least one embodiment, the substrate 110 includes a Si(111) wafer to provide an optimal lattice mismatch with an overlying layer, such as a GaN layer described herein.

The transition structure 120 includes a nucleation layer 122 over the substrate 110. The nucleation layer 122 has a lattice structure and/or a thermal expansion coefficient (TEC) suitable for bridging the lattice mismatch and/or the TEC mismatch between the substrate 110 and an overlying layer, such as a GaN layer described herein. In some embodiments, the nucleation layer 122 includes aluminum nitride (AlN). In some embodiments, the nucleation layer 122 has a thickness of 70 to 300 nanometers (nm). In some embodiments, the nucleation layer 122 is omitted.

The transition structure 120 further includes a transition layer 124 over the nucleation layer 122, or over the substrate 110 in one or more embodiments where the nucleation layer 122 is omitted. The transition layer 124 further facilitates gradual changes of lattice structures and TECs between the nucleation layer 122 (or the substrate 110) and an overlying layer, such as a GaN layer described herein. In some embodiments, the transition layer 124 includes a graded aluminum-gallium nitride ($Al_xGa_{(1-x)}N$, x is the aluminum content ratio in the aluminum-gallium constituent, 0<x<1) layer. In some embodiments, the graded aluminum gallium nitride layer includes multiple layers each having a decreased ratio x, from a bottom layer adjacent the substrate 110 to a top layer adjacent the buffer layer 130. In at least one embodiment, the graded aluminum gallium nitride layer has three layers having the x ratio in the range of 0.7-0.9 for the bottom layer, in the range of 0.4-0.6 for a middle layer, and in the range of 0.15-0.3 for the top layer. In some embodiments, instead of having multiple layers with different x ratios, the graded aluminum gallium nitride layer has a continuous gradient of the ratio x. In some embodiments, the transition layer 124 has a thickness of 500 to 1050 nm. In some embodiments, the transition layer 124 is omitted.

The buffer layer 130 defines a high resistivity layer for increasing the breakdown voltage of the semiconductor device 100. In some embodiments, the buffer layer 130 includes one or more Group III-V compound layers. Examples of Group III-V compound layers include, but are not limited to, GaN, AlGaN, InGaN and InAlGaN. In some embodiments, the buffer layer 130 includes a dopant to achieve a predetermined high resistivity. In at least one embodiment, the dopant is a p-type dopant. In at least one embodiment, the buffer layer 130 includes GaN doped with the p-type dopant. Examples of the p-type dopant include, but are not limited to, C, Fe, Mg and Zn. In at least one embodiment, a concentration of the p-type dopant in the buffer layer 130 is greater than or equal to about 5E18 ions/cm$^3$. In at least one embodiment, the buffer layer 130 has a thickness of 500 to 2000 nm.

The channel layer 140 has a lower resistivity than the buffer layer 130, for improving current performance of the semiconductor device 100. In some embodiments, the channel layer 140 includes one or more Group III-V compound layers. Examples of Group III-V compound layers include, but are not limited to, GaN, AlGaN, InGaN and InAlGaN. One or more of the Group III-V compound layers is doped in at least one embodiment. In one or more embodiments, the channel layer 140 includes alternatingly arranged p-doped and n-doped Group III-V compound layers. In at least one embodiment, the channel layer 140 includes a p-doped GaN layer. Examples of the p-type dopant in the p-doped GaN layer include, but are not limited to, C, Fe, Mg and Zn. In at least one embodiment, the concentration of the p-type dopant in the channel layer 140 is lower than that of the buffer layer 130. For example, the concentration of the p-type dopant in the channel layer 140 is lower than or equal to 1E17 ions/cm$^3$. In at least one embodiment, the channel layer 140 has a thickness of 200 to 500 nm.

The active layer 150 includes one or more Group III-V compound layers which are different from the Group III-V compound layers of the channel layer 140 in composition. In some embodiments, the active layer 150 comprises AlN, $Al_yGa_{(1-y)}N$ (where y is the aluminum content ratio, 0<y<1), or a combination thereof. The active layer 150 is configured to cause a 2DEG to be formed in the channel layer 140 along an interface 141 between the channel layer 140 and the active layer 150. A heterojunction is formed between the active layer 150 and the channel layer 140 having two different semiconductor materials. A band gap discontinuity exists between the active layer 150 and the channel layer 140. The electrons from a piezoelectric effect in the active layer 150 drop into the channel layer 140, and thus create a thin layer 143 of highly mobile conducting electrons, i.e., the 2DEG, in the channel layer 140, adjacent the interface 141 with the active layer 150. The electrons in the 2DEG are charge carriers in the channel layer 140. In some embodiments, when a sufficient voltage is applied to the gate electrode 180, it is possible to modulate a current (i.e., a drain current) flowing through the channel layer 140, from the drain electrode 174 to the source electrode 172.

The 2DEG is generated naturally at the interface 141 of different Group III-V compound materials forming the heterojunction between the channel layer 140 and the active layer 150. Due to the naturally occurring 2DEG, the semiconductor device 100 is conductive without the application of a voltage to the gate electrode 180, i.e., the semiconductor device 100 is a normally ON device in some embodiments.

In some embodiments, the semiconductor device 100 is converted to a normally OFF device. For example, the gate electrode 180 includes a gate structure configured to deplete the 2DEG under the gate structure, i.e., the 2DEG is depleted in an area 144 under the electrode 180, leaving the 2DEG in areas 145, 146, between (i) the electrode 180 and (ii) the source electrode 172 and the drain electrode 174, respectively. In at least one embodiment, the gate structure of the electrode 180 includes a p-doped layer over the active layer 150, and an n-doped layer over the p-doped layer. Example materials for the p-doped layer and/or the n-doped layer include, but are not limited to, GaN, AlGaN, InGaN and InAlGaN. Examples of p-type dopants include, but are not limited to, carbon, iron, magnesium, and zinc. Examples of n-type dopants include, but are not limited to, silicon and oxygen. In at least one embodiment, the n-doped layer is omitted.

The barrier structure 160 comprises at least one of a first barrier layer 162 or a second barrier layer 164. The first barrier layer 162 is formed between the transition structure 120 and the buffer layer 130. The first barrier layer 162 is configured to block diffusion of the material of the substrate 110 to the buffer layer 130. The second barrier layer 164 is formed between the buffer layer 130 and the channel layer 140. The second barrier layer 164 is configured to block diffusion of the p-type dopant from the buffer layer 130 into the channel layer 140.

Without the first barrier layer 162, the material of the substrate 110, e.g., Si, has a tendency to diffuse into the buffer layer 130, as shown by arrow 166. The Si diffusion into the buffer layer 130 reduces the resistivity of the buffer layer 130, and as a result, the breakdown voltage of the semiconductor device is negatively affected. A counter-measure to the resistivity reduction due to Si diffusion is to increase the concentration of the p-type dopant in the buffer layer 130. For example, in situations where the buffer layer 130 comprises a C-doped GaN layer, it is possible to increase the C concentration in the GaN layer as a counter-measure to the resistivity reduction due to Si diffusion. However, such a heavily-doped GaN layer is to be formed, e.g., grown, at a low pressure and/or a low temperature, which tend to degrade GaN layer crystal quality. As a consequence, other performance characteristics of the semiconductor device are likely affected. For example, degraded GaN layer crystal quality impacts dynamic ON resistance and/or causes current collapse.

In some embodiments, the first barrier layer 162 between the substrate 110 and the buffer layer 130 blocks diffusion of the material, e.g., Si, of the substrate 110 into the buffer layer 130. As a result, the resistivity of the buffer layer 130 is not, or less likely, affected by Si diffusion. The breakdown voltage of the semiconductor device 100 is obtainable without over-increasing the p-type dopant concentration in the buffer layer 130. Degraded GaN layer crystal quality and various associated effects, such as potential negative impact on dynamic ON resistance and/or current collapse, are avoidable. Examples of materials for the first barrier layer 162 include, but are not limited to, SiC, $SiCN_x$ (where 0<x<0.5) and BN. In at least one embodiment, the first barrier layer 162 has a thickness of 10 to 200 nm.

Without the second barrier layer 164, the p-type dopant of the buffer layer 130 has a tendency to diffuse into the channel layer 140, as shown by arrow 168. In some embodiments, the resistivity of the channel layer 140 is to be kept low to promote the current flow between the source electrode 172 and the drain electrode 174. Because the p-type dopant has a positive charge, the p-type dopant diffused into the channel layer 140 attracts electrons from the 2DEG, reducing the electron density in the 2DEG and increasing the resistivity of the channel layer 140. As a result, the current performance of the semiconductor device is negatively affected. In situations where the concentration of the p-type dopant in the buffer layer 130 is increased, e.g., as the described counter-measure to Si diffusion, the increased concentration of the p-type dopant in the buffer layer 130 increases the p-type dopant diffusion from the buffer layer 130 into the channel layer 140, further increasing the described negative impact on the current performance of the semiconductor device.

In some embodiments, the second barrier layer 164 between the buffer layer 130 and the channel layer 140 blocks diffusion of the p-type dopant, e.g., C, into the channel layer 140. As a result, the resistivity of the channel layer 140 is not, or less likely, affected by C diffusion. The current performance of the semiconductor device 100 is maintainable despite a high p-type dopant concentration in the buffer layer 130. Examples of materials for the second barrier layer 164 include, but are not limited to, SiC, $SiCN_x$ and BN. In at least one embodiment, the second barrier layer 164 has a thickness of 10 to 200 nm. In some embodiments, one of the first barrier layer 162 and the second barrier layer 164 is omitted. In embodiments where both the first barrier layer 162 and the second barrier layer 164 are included in the semiconductor device 100, it is possible to provide a semiconductor device with high breakdown voltage and high current density, while avoiding or minimizing potential negative impact on dynamic ON resistance and/or potential current collapse.

Figure 2:
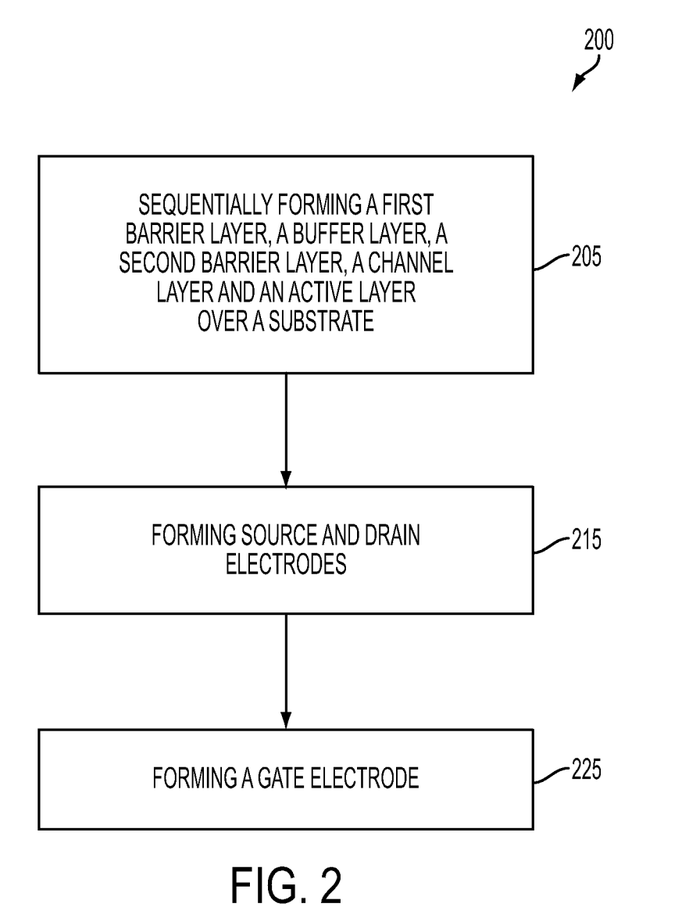
FIG. 2 is a flow chart of a method of manufacturing a semiconductor device in accordance with some embodiments.

FIG. 2 is a flow chart of a method 200 of manufacturing a semiconductor device in accordance with some embodiments, and FIGS. 3A-3F are schematic cross-sectional views of the semiconductor device at various stages during manufacture in accordance with some embodiments.

Figure 3A:
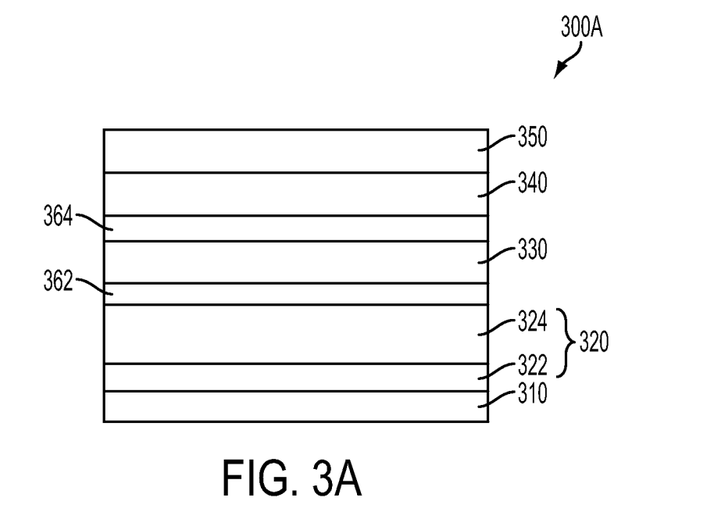
FIGS. 3A-3F are schematic cross-sectional views of a semiconductor device at various stages during manufacture in accordance with some embodiments.

At operation 205 in FIG. 2, a first barrier layer, a buffer layer, a second barrier layer, a channel layer and an active layer are sequentially formed over a substrate. For example, as shown in FIG. 3A, a substrate 310 is provided, and a transition structure 320, a first barrier layer 362, a buffer layer 330, a second barrier layer 364, a channel layer 340 and an active layer 350 are sequentially formed over the substrate 310, resulting in a structure 300A. In some embodiments, the substrate 310, the transition structure 320, the first barrier layer 362, the buffer layer 330, the second barrier layer 364, the channel layer 340 and the active layer 350 correspond to the substrate 110, the transition structure 120, the first barrier layer 162, the buffer layer 130, the second barrier layer 164, the channel layer 140 and the active layer 150 described with respect to FIG. 1.

As shown in FIG. 3A, the transition structure 320 includes a nucleation layer 322 over the substrate 310. In at least one embodiment, the substrate 310 includes an Si(111) substrate. In some embodiments, the nucleation layer 322 comprises AlN. In some embodiments, the nucleation layer 322 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the nucleation layer 322 includes a lower AlN layer and an upper AlN layer. In at least one embodiment, the lower AlN layer is formed at a lower temperature than the upper AlN layer, and the lower AlN layer is referred to as a low temperature (LT) AlN layer whereas the upper AlN layer is referred to as a high temperature (HT) AlN layer. For example, the lower AlN layer is formed, e.g., grown, at a temperature of 900 to 1000° C. to a thickness of 20 to 80 nm, and the upper AlN layer is formed, e.g., grown, at a higher temperature of 1000 to 1300° C. to a thickness of 50 to 200 nm. In some embodiments, the nucleation layer 322 comprises a material other than AlN. In some embodiments, the nucleation layer 322 and the operation for forming the nucleation layer 322 are omitted.

The transition structure 320 includes a transition layer 324 over the nucleation layer 322, or over the substrate 310. In some embodiments, the transition layer 324 is a graded aluminum-gallium nitride AlxGa(1−x)N layer. In some embodiments, the graded aluminum gallium nitride layer has two or more of aluminum-gallium nitride layers each having a different ratio x decreased from the bottom to the top. In some embodiments, each of the two or more of aluminum-gallium nitride layers is formed by an epitaxial growth process, such as an MOCVD process using aluminum-containing precursor, gallium-containing precursor, and nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In at least one embodiment, the transition layer 324 includes a bottom AlGaN layer, a middle AlGaN layer and a top AlGaN layer. The bottom AlGaN layer has the aluminum content ratio x of 0.7 to 0.9 and is formed, e.g., grown, at a temperature of 1000 to 1200° C. to a thickness of 50 to 200 nm. The middle AlGaN layer has the aluminum content ratio x of 0.4 to 0.6 and is formed, e.g., grown, at a temperature of 1000 to 1200° C. to a thickness of 150 to 250 nm. The top AlGaN layer has the aluminum content ratio x of 0.15 to 0.3 and is formed, e.g., grown, at a temperature of 1000 to 1200° C. to a thickness of 350 to 650 nm. Other numbers of AlGaN layers and/or aluminum content ratios in individual AlGaN layers are within the scope of various embodiments. In some embodiments, the graded aluminum gallium nitride layer has a continuous gradient of the ratio x gradually decreased from the bottom to the top and is formed by an MOCVD process. In some embodiments, the transition layer 324 and the operation for forming the transition layer 324 are omitted.

The first barrier layer 362 is formed over the transition structure 320, or over the substrate 310 in at least one embodiment where the transition structure 320 is not formed. The first barrier layer 362 includes a material that defines a diffusion barrier to the material of the substrate 310. For example, when the substrate 110 is a Si substrate, the first barrier layer 362 includes one or more of SiC, $SiCN_x$ and BN. In at least one embodiment, the first barrier layer 362 includes SiC. An advantage possibly achievable with the first barrier layer 362 made of SiC is that SiC has a close lattice mismatch with GaN which, in one or more embodiments, is the material of the buffer layer 330 to be grown on SiC of the first barrier layer 362. As a result, the growth and/or crystal quality of GaN in the buffer layer 330 are improved. Another advantage possibly achievable with the first barrier layer 362 made of SiC is that SiC has a TEC between the TEC of GaN which, in one or more embodiments, is the material of the buffer layer 330 to be grown on SiC of the first barrier layer 362, and the TEC of Si which, in one or more embodiments, is the material of the substrate 310 underlying the first barrier layer 362. As a result, TEC matching from the substrate 310 to the buffer layer 330 is improved. In some embodiments, the first barrier layer 362 is formed, e.g., grown, by a low-pressure chemical vapor deposition (LPCVD) process or an MBE process to a thickness of 10-200 nm, at a temperature of 900 to 1200° C. and a pressure equal to or less than 100 Pa. The obtained first barrier layer 362 is a crystalline layer.

The buffer layer 330 is formed over the first barrier layer 362. In some embodiments, the buffer layer 330 includes a p-type dopant. In at least one embodiment, the buffer layer 330 includes GaN doped with the p-type dopant. Examples of the p-type dopant include, but are not limited to, C, Fe, Mg and Zn. In at least one embodiment, a concentration of the p-type dopant in the buffer layer 330 is greater than or equal to about 5E18 ions/cm$^3$. In some embodiments, the buffer layer 330 is formed by an epitaxial growth process, such as an MOCVD process or an MBE process. In some embodiments, the buffer layer 330 is formed, e.g., grown, by an MOCVD process to a thickness of 500 to 2000 nm, at a temperature of 1000 to 1100° C. and a pressure equal to or less than 100 Pa. In at least one embodiment, the MOCVD uses gallium-containing precursor (TMGa) in vapor form and nitrogen-containing precursor (e.g., gaseous NH$_3$) at an NH$_3$/TMGa ratio equal to or less than 500.

The second barrier layer 364 includes a material that defines a diffusion barrier to the p-type dopant of the buffer layer 330. For example, when the p-type dopant of the buffer layer 330 is C or Fe, the second barrier layer 364 includes one or more of SiC, SiCN$_x$ and BN. An advantage possibly achievable with the second barrier layer 364 made of SiC is that SiC has a close lattice mismatch with GaN which, in one or more embodiments, is the material of the channel layer 340 to be grown on SiC of the second barrier layer 364. As a result, the growth and/or crystal quality of GaN in the channel layer 340 are improved. In some embodiments, the second barrier layer 364 is formed, e.g., grown, by an LPCVD process or an MBE process to a thickness of 10-200 nm, at a temperature of 900 to 1200° C. and a pressure equal to or less than 100 Pa. The obtained second barrier layer 364 is a crystalline layer.

The channel layer 340 is formed over the second barrier layer 364. In some embodiments, the channel layer 340 includes one or more Group III-V compound layers. One or more of the Group III-V compound layers is doped in at least one embodiment. In at least one embodiment, the channel layer 340 includes a p-doped GaN layer. Examples of the p-type dopant in the p-doped GaN layer include, but are not limited to, C, Fe, Mg and Zn. In at least one embodiment, the concentration of the p-type dopant in the channel layer 340 is lower than that of the buffer layer 330. For example, the concentration of the p-type dopant in the channel layer 340 is lower than or equal to 1E17 ions/cm$^3$. In some embodiments, the channel layer 340 is formed by an epitaxial growth process, such as an MOCVD process or an MBE process. In some embodiments, the channel layer 340 is formed, e.g., grown, by an MOCVD process to a thickness of 200 to 500 nm, at a temperature of 1000 to 1200° C. and a pressure equal to or less than 200 Pa. In at least one embodiment, the MOCVD uses gallium-containing precursor (TMGa) in vapor form and nitrogen-containing precursor (e.g., gaseous NH$_3$) at an NH$_3$/TMGa ratio equal to or less than 1000. In some embodiments, at least one of the growth temperature, the growth pressure or the NH$_3$/TMGa ratio for forming the first barrier layer 362 is/are lower than that for forming the second barrier layer 364.

The active layer 350 is formed over the channel layer 340. In some embodiments, the active layer 350 includes AlGaN, InAlGaN or a combination thereof. In some embodiments, the active layer 350 is formed by an epitaxial growth process, such as an MOCVD process using aluminum-containing precursor, gallium-containing precursor, and nitrogen-containing precursor. In at least one embodiment, the active layer 350 includes a lower AlN layer and an upper Al$_y$Ga$_{(1-y)}$N layer. The lower AlN layer is formed, e.g., grown, at a temperature of 1000 to 1200° C. to a thickness of 0.5 to 1.5 nm. The upper Al$_y$Ga$_{(1-y)}$N layer has the aluminum content ratio y of 0.1 to 0.3 and is formed, e.g., grown, at a temperature of 1000 to 1200° C. to a thickness of 10 to 40 nm.

Figure 3B:
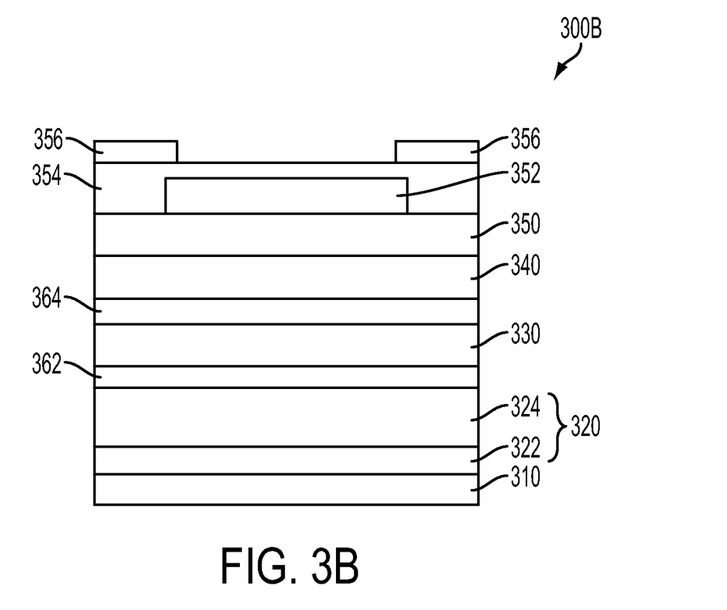

At operation 215 in FIG. 2, a source electrode and a drain electrode are formed. For example, as shown in FIG. 3B, a first passivation layer 352 is formed over the structure 300A in a region not corresponding to the source and drain electrodes to be formed. Examples of materials for the first passivation layer 352 include, but are not limited to, silicon nitride, silicon oxide, and silicon oxynitride. In at least one embodiment, the first passivation layer 352 is SiN formed by chemical vapor deposition (CVD) to a thickness of 100 nm. A first metal layer 354 is formed over the first passivation layer 352. In some embodiments, the first metal layer 354 includes a stack of metal layers, such as Ti/Al/Ti or Ti/Al/Ti/TiN. A first photoresist layer 356 is formed, e.g., by a lithography process, over the first metal layer 354 in regions corresponding to the source and drain electrodes to be formed. A resulting structure 300B is obtained as shown in FIG. 3B.

Figure 3C:
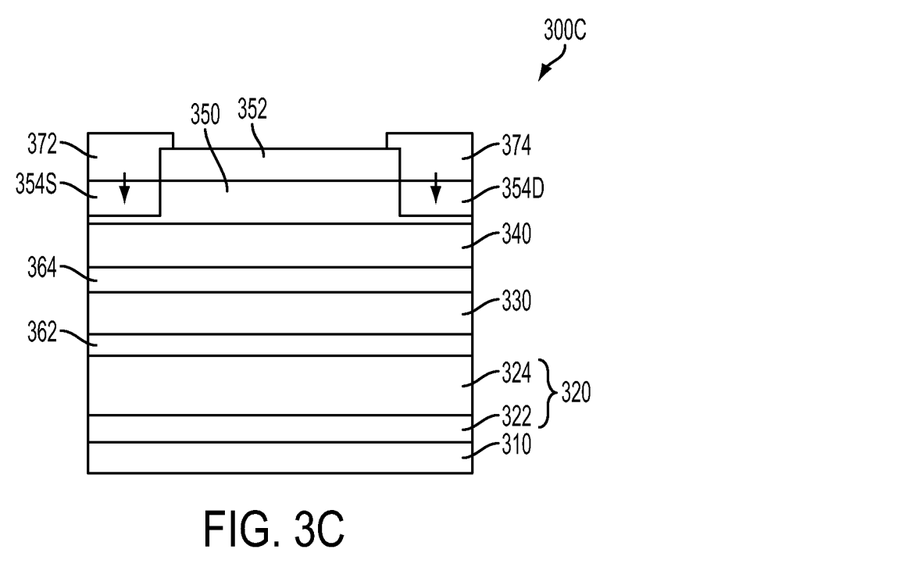

As shown in FIG. 3C, the first metal layer 354 not covered by the first photoresist layer 356 is etched to form a source electrode 372 and a drain electrode 374. The first photoresist layer 356 is then removed. An annealing process is performed to form ohmic contacts 354S and 354D under the source electrode 372 and the drain electrode 374, respectively. The ohmic contacts 354S and 354D are formed by the metal diffused from the source electrode 372 and the drain electrode 374 into the active layer 350. For example, the annealing process is performed at 850° C. for 60 seconds. A resulting structure 300C is obtained as shown in FIG. 3C.

Figure 3D:
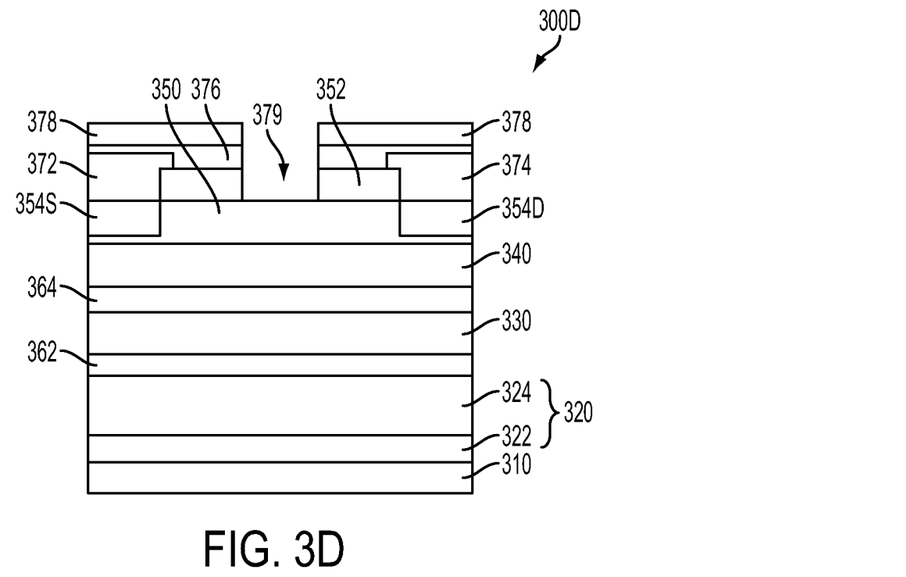

At operation 225 in FIG. 2, a gate electrode is formed. For example, as shown in FIG. 3D, a second passivation layer 376 is formed over the structure 300C. Examples of materials for the second passivation layer 376 include, but are not limited to, silicon nitride, silicon oxide, and silicon oxynitride. In at least one embodiment, the second passivation layer 376 is SiN formed by chemical vapor deposition (CVD) to a thickness of 100 nm. A second photoresist layer 378 is formed, e.g., by a lithography process, over the second passivation layer 376 in regions not corresponding to the gate electrode to be formed. The first passivation layer 352 and the second passivation layer 376 are etched, using the second photoresist layer 378 as a mask, to form an opening 379 exposing the underlying active layer 350. A resulting structure 300D is obtained as shown in FIG. 3D.

Figure 3E:
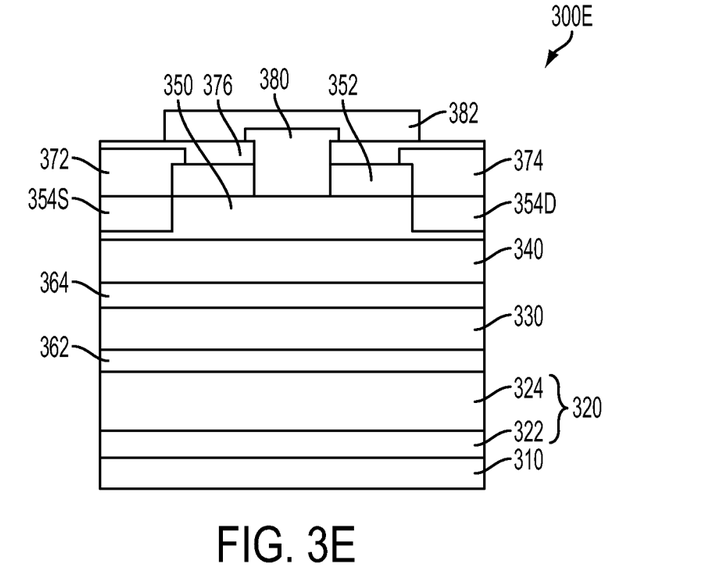

As shown in FIG. 3E, a second metal layer is deposited over the structure 300D, filling the opening 379. The second metal layer outside the filled opening 379 is etched to form a gate electrode 380. In at least one embodiment, a gate dielectric layer is lined in the opening 379 before the opening 379 is filled with the second metal layer. Examples of materials for the gate dielectric layer include, but are not limited to, TiN and SiN. A third photoresist layer 382 is formed over the resulting structure including the gate electrode 380, in a region not corresponding to the source electrode 372 and the drain electrode 374. A resulting structure 300E is obtained as shown in FIG. 3E.

Figure 3F:
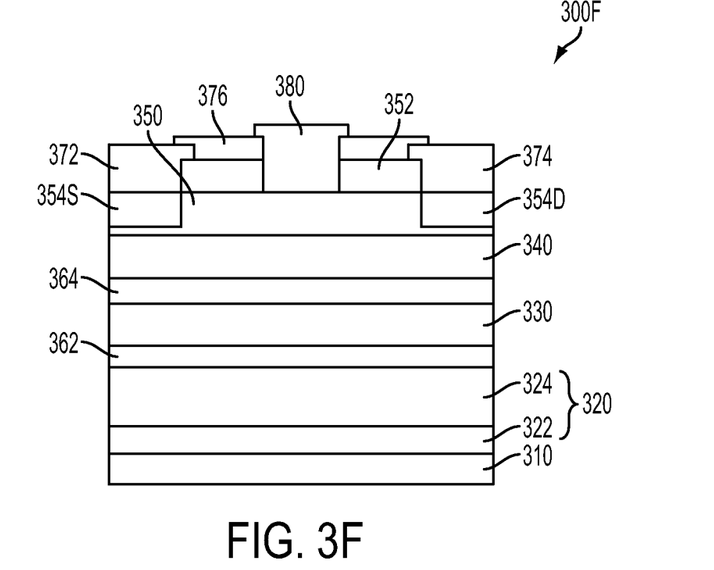

As shown in FIG. 3F, the second passivation layer 376 not covered by the third photoresist layer 382 is etched, using the third photoresist layer 382 as a mask, to expose the source electrode 372 and the drain electrode 374. A resulting semiconductor device 300F is obtained as shown in FIG. 3F.

In some embodiments, a gate structure including a p-doped layer and an n-doped layer over the p-doped layer is formed over the active layer 350 and under the gate electrode 380. For example, the p-doped layer and the n-doped layer are sequentially formed over the structure 300A described with respect to FIG. 3A. The p-doped layer and the n-doped layer outside a gate region where the gate electrode 380 is to be formed is removed to obtain the gate structure. The operations described with respect to FIGS. 3B-3F are subsequently performed. In at least one embodiment, the p-doped layer includes a p-GaN layer. For example, the p-GaN layer includes Mg-doped GaN having the Mg concentration of about 1E19 atoms/cm$^3$. The Mg-doped GaN layer is formed, e.g., grown, by an MOCVD process, to a thickness of about 75 nm. In at least one embodiment, the n-doped layer includes an n-GaN layer. For example, the n-GaN layer includes Si-doped GaN having the Si concentration of about 1E18 atoms/cm$^3$. The Si-doped GaN layer is formed, e.g., grown, by an MOCVD process, to a thickness of about 50 nm. In some embodiments, the n-doped layer and the operation for forming the n-doped layer are omitted.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a semiconductor device comprises a substrate, a channel layer over the substrate, an active layer over the channel layer, and a barrier structure between the substrate and the channel layer. The active layer is configured to cause a two dimensional electron gas (2DEG) to be formed in the channel layer along an interface between the channel layer and the active layer. The barrier structure is configured to block diffusion of at least one of a material of the substrate or a dopant toward the channel layer.

According to some embodiments, a High Electron Mobility Transistor (HEMT) comprises a Si substrate, a first barrier layer over the Si substrate, a buffer layer over the first barrier layer, a second barrier layer over the buffer layer, a channel layer over the second barrier layer, and an active layer over the channel layer. The first barrier layer comprises at least one material selected from the group consisting of SiC, SiCNx and BN. The buffer layer comprises GaN doped with a p-type dopant. The second barrier layer comprises at least one material selected from the group consisting of SiC, SiCNx and BN. The channel layer comprises GaN. The active layer comprises $Al_yGa_{(1-y)}N$.

In a method of manufacturing a semiconductor device in accordance with some embodiments, a first barrier layer is formed over a substrate. The first barrier layer defines a diffusion barrier to a material of the substrate. A buffer layer is formed over the first barrier layer. The buffer layer comprises a p-type dopant. A second barrier layer is formed over the buffer layer. The second barrier layer defines a diffusion barrier to the p-type dopant of the buffer layer. A channel layer is formed over the second barrier layer. An active layer is formed over the channel layer.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device, comprising:
   a substrate;
   a channel layer over the substrate;
   an active layer over the channel layer, the active layer configured to cause a two dimensional electron gas (2DEG) to be formed in the channel layer along an interface between the channel layer and the active layer; and
   a barrier structure between the substrate and the channel layer, the barrier structure configured to block diffusion of at least one of a material of the substrate or a dopant toward the channel layer.

2. The semiconductor device of claim 1, further comprising:
   a buffer layer between the substrate and the channel layer, the buffer layer having a higher resistivity than a resistivity of the channel layer.

3. The semiconductor device of claim 2, wherein the barrier structure comprises a first barrier layer between the substrate and the buffer layer, the first barrier layer configured to block diffusion of the material of the substrate to the buffer layer.

4. The semiconductor device of claim 3, wherein the barrier structure comprises a second barrier layer between the buffer layer and the channel layer, the second barrier layer configured to block diffusion of the dopant from the buffer layer to the channel layer.

5. The semiconductor device of claim 4, wherein at least one of the first barrier layer or the second barrier layer comprises at least one material selected from the group consisting of SiC, $SiCN_x$ and BN.

6. The semiconductor device of claim 2, wherein the dopant comprises a p-type dopant.

7. The semiconductor device of claim 6, wherein the p-type dopant comprises at least one element selected from the group consisting of C, Fe, Mg and Zn.

8. The semiconductor device of claim 6, wherein the channel layer comprises the p-type dopant at a concentration lower than a concentration of the p-type dopant in the buffer layer.

9. The semiconductor device of claim 2, wherein the barrier structure comprises a barrier layer between the buffer layer and the channel layer, the barrier layer configured to block diffusion of the dopant from the buffer layer to the channel layer.

10. The semiconductor device of claim 9, wherein the barrier layer comprises at least one material selected from the group consisting of SiC, $SiCN_x$ and BN.

11. A High Electron Mobility Transistor (HEMT), comprising:
    a Si substrate;
    a first barrier layer over the Si substrate, the first barrier layer comprising at least one material selected from the group consisting of SiC, $SiCN_x$ and BN;
    a buffer layer over the first barrier layer, the buffer layer comprising GaN doped with a p-type dopant;
    a second barrier layer over the buffer layer, the second barrier layer comprising at least one material selected from the group consisting of SiC, $SiCN_x$ and BN;
    a channel layer over the second barrier layer, the channel layer comprising GaN; and
    an active layer over the channel layer, the active layer comprising $Al_yGa_{(1-y)}N$.

12. The HEMT of claim 11, wherein the p-type dopant comprises at least one element selected from the group consisting of C, Fe, Mg and Zn.

13. The HEMT of claim 11, wherein the channel layer comprises the p-type dopant at a concentration lower than a concentration of the p-type dopant in the buffer layer.

14. The HEMT of claim 11, further comprising:
an AlN layer over the Si substrate; and
a plurality of AlGaN layers over the AlN layer and under the first barrier layer, the plurality of AlGaN layers having an Al concentration reducing toward the first barrier layer.

15. The HEMT of claim 11, wherein each of the first and second barrier layers has a thickness of 10 to 200 nm.

16. A High Electron Mobility Transistor (HEMT), comprising:
a substrate;
a buffer layer over the substrate, the buffer layer comprising GaN;
a first barrier layer between the substrate and the buffer layer, the first barrier layer configured to block diffusion of the material of the substrate or a first dopant;
a channel layer over the buffer layer, the channel layer comprising GaN;
a second barrier layer between the buffer layer and the channel layer, the second barrier layer configured to block diffusion of a material of the buffer layer or a second dopant;
an active layer over the channel layer, the active layer comprising $Al_y Ga_{(1-y)}N$.

17. The HEMT of claim 16, wherein each of the first barrier layer and the second barrier layer independently comprises at least one material selected from the group consisting of SiC, $SiCN_x$, and BN.

18. The HEMT of claim 16, wherein each of the first barrier layer and the second barrier layer independently has a thickness of 10 nanometers (nm) to 200 nm.

19. The HEMT of claim 16, wherein the active layer has a thickness ranging from 10 nm to 40 nm.

20. The HEMT of claim 16, wherein the channel layer has a thickness of 200 nm to 500 nm.

* * * * *